(12) United States Patent
Russell et al.

(10) Patent No.: US 8,192,805 B2
(45) Date of Patent: *Jun. 5, 2012

(54) METHOD TO IMPROVE ELECTRICAL LEAKAGE PERFORMANCE AND TO MINIMIZE ELECTROMIGRATION IN SEMICONDUCTOR DEVICES

(75) Inventors: Noel Russell, Malta, NY (US); Steven Sherman, Newton, MA (US); John J. Hautala, Beverly, MA (US)

(73) Assignee: TEL Epion Inc., Billerica, MA (US)

( * ) Notice: Subject to any disclaimer, the term of this patent is extended or adjusted under 35 U.S.C. 154(b) by 650 days.

This patent is subject to a terminal disclaimer.

(21) Appl. No.: 12/338,582

(22) Filed: Dec. 18, 2008

(65) Prior Publication Data

US 2009/0104754 A1    Apr. 23, 2009

Related U.S. Application Data

(63) Continuation-in-part of application No. 11/863,036, filed on Sep. 27, 2007, now Pat. No. 7,981,483.

(51) Int. Cl.
*C23C 14/48* (2006.01)
*C23C 14/02* (2006.01)
*C23C 14/58* (2006.01)
*B05D 5/12* (2006.01)
*B05D 3/06* (2006.01)
*H01L 21/3115* (2006.01)
*H01L 21/3215* (2006.01)

(52) U.S. Cl. ........ 427/526; 427/523; 427/525; 427/527; 427/529; 427/530; 427/528; 427/531; 438/766; 438/783; 438/474

(58) Field of Classification Search .................. None
See application file for complete search history.

(56) References Cited

U.S. PATENT DOCUMENTS

| | | |
|---|---|---|
| 4,361,762 A | 11/1982 | Douglas |
| 4,886,971 A | 12/1989 | Matsumura et al. |
| 4,916,311 A | 4/1990 | Fuzishita et al. |
| 6,124,620 A | 9/2000 | Gardner et al. |
| 6,174,793 B1 | 1/2001 | Tsai et al. |
| 6,268,291 B1 | 7/2001 | Andricacos et al. |
| 6,589,874 B2 | 7/2003 | Andricacos et al. |
| 6,784,095 B1 | 8/2004 | Pangrle et al. |
| 7,259,036 B2 | 8/2007 | Borland et al. |
| 7,276,441 B1 | 10/2007 | Cui et al. |

(Continued)

FOREIGN PATENT DOCUMENTS

EP     0875929 A2    11/1996

(Continued)

OTHER PUBLICATIONS

Isao Yamada et al., "Materials Processing by Gas Cluster Ion Beams", Materials Science and Engineering Reports, vol. 34, Issue 6, pp. 231-295, Oct. 30, 2001 (ISSN 09S7-796X).

(Continued)

*Primary Examiner* — Marianne L Padgett
(74) *Attorney, Agent, or Firm* — Wood, Herron & Evans, LLP

(57) ABSTRACT

Embodiments of methods for improving electrical leakage performance and minimizing electromigration in semiconductor devices are generally described herein. Other embodiments may be described and claimed.

10 Claims, 3 Drawing Sheets

U.S. PATENT DOCUMENTS

| | | | |
|---|---|---|---|
| 7,396,745 B2 | 7/2008 | Borland et al. | |
| 7,410,890 B2 | 8/2008 | Kirkpatrick et al. | |
| 7,737,013 B2 | 6/2010 | Yin et al. | |
| 7,775,743 B1 | 8/2010 | Kelley | |
| 7,799,683 B2 * | 9/2010 | Learn et al. | 438/687 |
| 7,838,423 B2 * | 11/2010 | Learn et al. | 438/687 |
| 7,863,194 B2 | 1/2011 | Yin et al. | |
| 7,871,929 B2 * | 1/2011 | Russell et al. | 438/687 |
| 7,981,483 B2 * | 7/2011 | Russell et al. | 427/528 |
| 8,013,312 B2 * | 9/2011 | Adams | 250/423 R |
| 2002/0130275 A1 | 9/2002 | Mack et al. | |
| 2005/0181621 A1 | 8/2005 | Borland et al. | |
| 2005/0277246 A1 | 12/2005 | Kirkpatrick et al. | |
| 2006/0105570 A1 * | 5/2006 | Hautala et al. | 438/687 |
| 2006/0115996 A1 | 6/2006 | Tsai et al. | |
| 2007/0148888 A1 | 6/2007 | Krull et al. | |
| 2007/0184655 A1 * | 8/2007 | Learn et al. | 438/687 |
| 2007/0184656 A1 * | 8/2007 | Sherman et al. | 438/687 |
| 2009/0104754 A1 | 4/2009 | Russell et al. | |
| 2009/0206270 A1 | 8/2009 | Glayish et al. | |
| 2009/0206281 A1 | 8/2009 | Oved et al. | |
| 2010/0029078 A1 | 2/2010 | Russell et al. | |
| 2010/0090303 A1 | 4/2010 | Takizawa | |
| 2010/0197135 A1 | 8/2010 | Ishizaka | |

FOREIGN PATENT DOCUMENTS

| | | | |
|---|---|---|---|
| JP | | 62296357 A | 12/1987 |
| WO | | 2006052958 A2 | 5/2006 |

OTHER PUBLICATIONS

Saitoh, Y. et al., Acceleration of cluster and molecular ions by TIARA 3 MV tandem accelerator, vol. 452, No. 1-2, Sep. 21, 2000, pp. 61-66, XP004210610, ISSN: 0168-9002.

Yamada, I. et al., Surface modification with gas cluster ion beams, Nuclear Instruments & Methods in Physics Research, vol. B79, Nov. 2, 1992, pp. 223-226, XP001031961, ISSN: 0168-583X.

European Patent Office, International Search Report and Written Opinion received in corresponding International Application No. PCT/US2008/076498 dated Dec. 9, 2008, 16 pp.

U.S. Patent and Trademark Office, final Office Action issued in related U.S. Appl. No. 11/863,036 dated Mar. 12, 2011, 36 pp.

Yamada, I. et al., Gas Cluster Ion Beam Processing for ULSI Fabrication, Materials Research Society Symposium Proceedings, vol. 427, 1996 (no month), Materials Research Society, pp. 265-276.

U.S. Patent and Trademark Office, Non-final Office Action issued in related U.S. Appl. No. 11/863,036 dated Sep. 24, 2010, 36 pp.

* cited by examiner

METHOD TO IMPROVE ELECTRICAL LEAKAGE PERFORMANCE AND TO MINIMIZE ELECTROMIGRATION IN SEMICONDUCTOR DEVICES

CROSS REFERENCE TO RELATED APPLICATION

This application is a continuation-in-part of U.S. patent application Ser. No. 11/863,036 filed Sep. 27, 2007 and entitled METHOD TO IMPROVE ELECTRICAL LEAKAGE PERFORMANCE AND TO MINIMIZE ELECTROMIGRATION IN SEMICONDUCTOR DEVICES, the disclosure of which is incorporated herein by reference in its entirety as if completely set forth herewith below.

FIELD OF THE INVENTION

The invention relates generally to methods and processing systems for improved dual damascene integration structures for semiconductor integrated circuits.

BACKGROUND OF THE INVENTION

The semiconductor industry has had tremendous success in delivering ever more cost effective chips to market through the use of scaling. However, while scaling works well in device or front-end semiconductor processing, device wiring is not amenable to scaling and results in degraded interconnect resistance and/or capacitance. To alleviate this problem, the industry has been migrating to the use of a lower resistance conductor, such as copper (Cu), and is also introducing lower-k (k=dielectric constant) insulators to reduce capacitance in damascene interconnect structures. Newly developed insulators in the ultra-low-k (ULK) range (k<2.5) are generally characterized by a great deal of porosity (e.g., 30-50%). These materials are extremely fragile and difficult to integrate since they are susceptible to contamination from other sources.

In a dual-damascene (DD) structure, a single metal deposition step is used to simultaneously form Cu metal lines and vias. The Cu metal lines and vias are formed by filling recessed features, such as a trench, a via, or other interconnect structure, in a dielectric film or substrate. After filling, the excess Cu metal that is deposited outside the recessed feature is removed by a chemical-mechanical polishing (CMP) process, thereby forming a planar structure with metal interconnect inlays.

BRIEF DESCRIPTION OF THE DRAWINGS

The present invention is illustrated by way of example and not as a limitation in the figures of the accompanying drawings.

DETAILED DESCRIPTION

There is a general need for improving the reliability of devices comprising copper and dielectric features, and in particular, conductive paths and dielectric regions between the conductive paths exposed by a planarization process. One way to improve reliability of devices is to getter metal impurities that may be present between conductive paths, resulting in an improved margin for line-to-line breakdown and electrical leakage performance. Metal impurities may be gettered between conductive paths, such as copper lines, by exposing a surface to a material source comprising one or more elements (hereafter "element(s)") selected from the group consisting of B, C, Si, Ge, N, P, As, O, S, and Cl using one or more methods such as thermal treatment while exposing the surface to a partial pressure of a gas or vapor, plasma treatment, ion implantation into the surface either directly or through an overlying layer, and/or infusion processing using one or more gas cluster ion beams (GCIBs) to form a doped layer in the conductive paths and the dielectric regions. Additionally, reliability may be improved by reducing electromigration of the conductive paths by incorporating the element(s) into the conductive paths thereby minimizing a transport of conductive material caused by a momentum transfer between conducting electrons and diffusing metal atoms.

Incorporating a doped layer into the conductive paths and the dielectric regions between conductive paths exposed by a planarization process reduces electromigration and provides an improved margin for line-to-line breakdown and electrical leakage performance, resulting in improved output parameters such as device or circuit characteristics.

Figure 1:
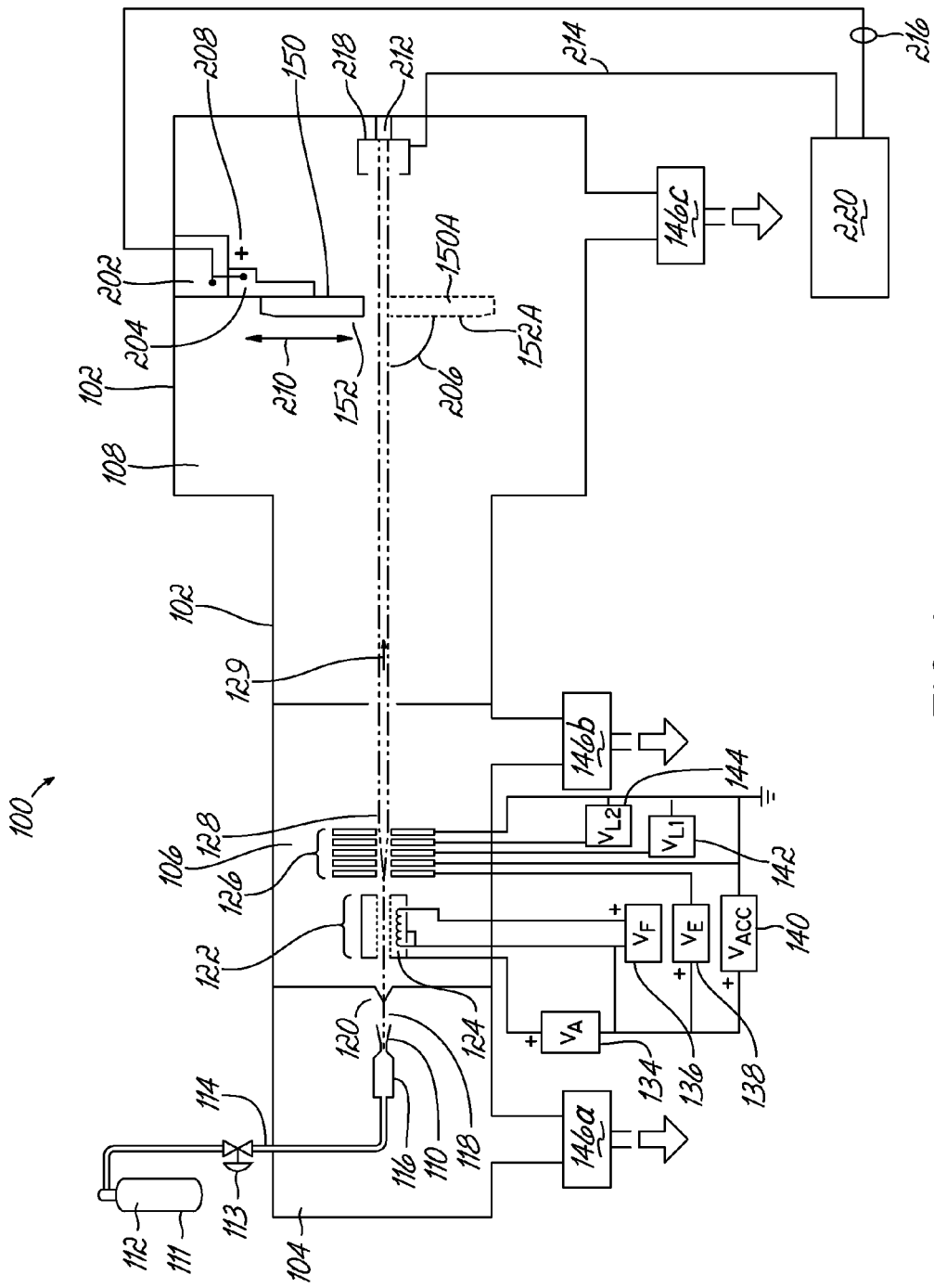
FIG. 1 is a diagrammatic view of a GCIB processing apparatus.

With reference to FIG. 1, a GCIB processing apparatus 100 includes a vacuum vessel 102 divided into three communicating chambers, a source chamber 104, an ionization/acceleration chamber 106, and a processing chamber 108. The chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. A condensable source gas 112 may be a gas that condenses at temperatures greater than 30 degrees Kelvin at one atmosphere whereas a non-condensable source gas may be a gas that condenses at temperatures less than or equal to 30 degrees Kelvin at one atmosphere. Suitable condensable source gases 112 include, but are not necessarily limited to $SiH_4$, $Si_2H_6$, $SiH_2Cl_2$, $SiCl_3H$, methylsilane, dimethylsilane, trimethylsilane, tetramethylsilane, ethylsilane, diethylsilane, triethylsilane, tetraethylsilane, $SiCl_4$, $SiF_4$, $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $N_2$, $H_2$, $O_2$, NO, $NO_2$, $N_2O$, $NH_3$, $NF_3$, HCl, $SF_6$, CO, $CO_2$, $C_2H_4$, $CH_4$, $C_2H_2$, $C_2H_6$, $C_3H_4$, $C_3H_6$, $C_3H_8$, $C_4H_6$, $C_4H_8$, $C_4H_{10}$, $C_5H_8$, $C_5H_{10}$, $C_6H_6$, $C_6H_{10}$, $C_6H_{12}$, $BF_3$, $B_2H_6$, $AsH_3$, $AsF_5$, $PH_3$, $PF_3$, $PCl_3$, or $PF_5$, or any combination of two or more thereof. A second condensable gas source may also be used, selected from the group consisting of argon, nitrogen, carbon dioxide, oxygen, and other gases and mixtures thereof. Suitable non-condensable source gases include, but are not necessarily limited to helium, neon, hydrogen, and mixtures thereof. In one example, the material source comprises phosphine and a non-condensable source gas selected from the group consisting of helium, neon, and hydrogen. In a further embodiment, the material source further comprises a second condensable gas source selected from the group consisting of argon, nitrogen, carbon dioxide, and oxygen.

Cooling, which results from the expansion in the jet, causes a portion of the gas jet 118 to condense into clusters, each comprising from several to several thousand weakly bound atoms or molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and processing chamber 108).

After the supersonic gas jet 118 containing gas-clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas-clusters in the gas jet 118, where the jet passes through the ionizer 122. The electron impact ejects electrons from the clusters, causing a portion the clusters to become positively ionized. Some clusters may have more than one electron ejected and may become multiply ionized. A set of suitably biased high voltage electrodes 126 extracts the cluster ions from the ionizer, forming a beam, and then accelerates them to a desired energy (typically with acceleration potentials of from several hundred V to several tens of kV) and focuses them to form a GCIB 128. Filament power supply 136 provides filament voltage $V_F$ to heat the ionizer filament 124. Anode power supply 134 provides anode voltage $V_A$ to accelerate thermoelectrons emitted from filament 124 to cause them to irradiate the cluster containing gas jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{Acc}$ to bias a high voltage electrode with respect to the ionizer 122 so as to result in a total GCIB acceleration potential equal to $V_{Acc}$. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, which can be disposed in the path of the GCIB 128. Since most applications contemplate the processing of large workpieces with spatially uniform results, a scanning system is desirable to uniformly scan the GCIB 128 across large areas to produce spatially homogeneous results.

The GCIB 128 is stationary, has a GCIB axis 129, and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150, in a raster-like scanning motion through GCIB 128 to cause a uniform (or otherwise programmed) irradiation of a surface of the workpiece 152 by the GCIB 128 for processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be any suitable angle, but is typically 90 degrees or near 90 degrees. During Y-scanning, the workpiece 152 and the workpiece holder 150 move from the position shown to the alternate position "A" indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 1, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is typically affixed to the wall of the vacuum vessel 102 with an electrically insulating mount 212.

A controller 220, which may be a microcomputer-based controller, connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve desired processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Figure 2A:
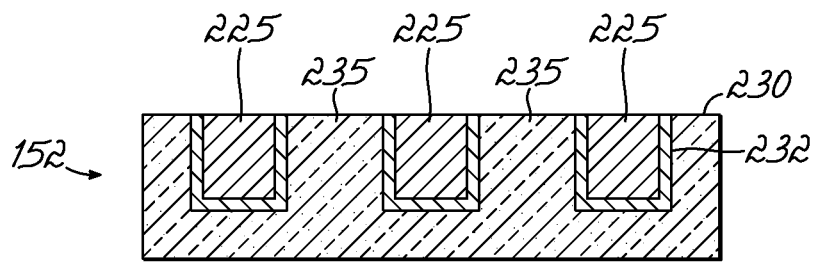
FIG. 2A is a cross-sectional view of a planarized workpiece illustrating conductive paths formed in recessed features.

With reference to FIG. 2A and in accordance with a representative embodiment, a cross-sectional view of a workpiece 152 with a planarized top surface 230 illustrating conductive paths 225 formed in recessed features is shown. A planarization process provides the planarized top surface 230 to create a uniform surface while improving the optical resolution of subsequent lithography steps. The planarization process may be terminated by detecting the presence of the top of a dielectric region 235. The conductive paths 225 may be formed from a damascene process or a dual damascene process by etching a plurality of interconnect holes, known as vias, followed by a trench etch into the workpiece 152, a pre-metal dielectric (PMD), or an inter-layer dielectric (ILD). The workpiece 152 may comprise silicon, germanium (Ge), or a III-V semiconductor such as gallium arsenide (GaAs) or indium antimonide (InSb). A top layer of the workpiece 152 may be formed from an epitaxial layer, a monocrystalline substrate or from a silicon-on-insulator (SOI) layer.

The series of interconnect holes and trenches formed through one or more etching processes may be referred to as recessed features. The recessed features are filled with a metal such as copper (Cu) using an electroplating or a physical vapor deposition process (PVD), which is subsequently planarized using a process such as chemical mechanical polishing (CMP), electropolishing, or ion milling to expose a dielectric of the workpiece 152, the PMD, and/or the ILD, and the conductive paths 225.

The conductive paths 225 may be lined with a barrier material 232 to limit the amount of material transfer between the conductive path 225 and the dielectric region 235. The barrier material 232 may be formed of one or more layers of tantalum, tantalum nitride, titanium, titanium nitride, tungsten, and/or tungsten nitride. The barrier material may be formed using layering techniques including physical vapor deposition (PVD), atomic layer deposition (ALD), chemical vapor deposition (CVD), plasma enhanced chemical vapor deposition (PECVD), thermal deposition, and evaporation.

Figure 2B:
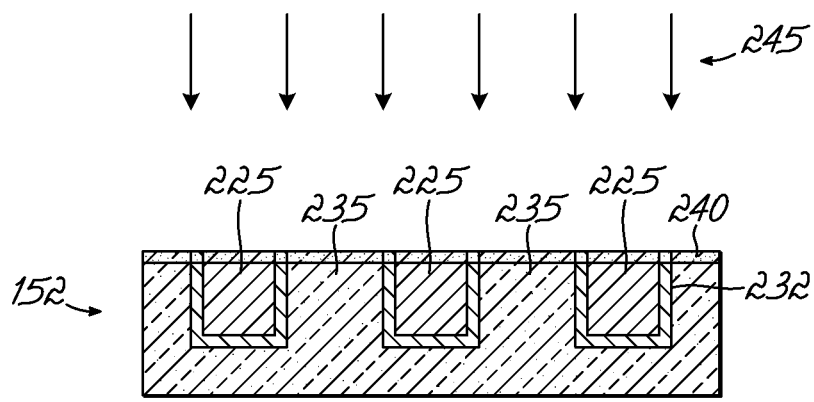
FIG. 2B is an illustration of the workpiece in FIG. 2A after treating a planar surface of the workpiece to form a phosphorous-doped layer.

FIG. 2B is an illustration of the workpiece 152 in FIG. 2A after treating the planarized top surface 230 of the workpiece 152 with a material source 245, such as a phosphorus source, to form a doped layer 240, such as a phosphorus-doped layer. The material source 245 comprising element(s) selected from the group consisting of B, C, Si, Ge, N, P, As, O, S, and Cl may be a partial pressure of a gas either in molecular or ionized form, a stream of ions in atomic or in ionized form, or a stream of ionized gas clusters comprising hundreds or thousands of atoms or molecules. The element(s) may react with the planarized top surface 230 and/or diffuse into the workpiece 152, or may be implanted or infused into the top surface 230. The material source 245 may be delivered by a system selected from the group consisting of a thermal treatment system, a plasma treatment system, an ion implantation system, and a gas cluster ion beam system to a dose from about $5 \times 10^{12}$ atoms/cm$^2$ to about $1 \times 10^{14}$ atoms/cm$^2$. The planarized top surface 230 may be doped to form a doped layer 240 comprising between 0.1 and 10 atomic % of the element(s).

In one embodiment of the invention, the element(s) is implanted to form the doped layer 240 with a peak element(s) concentration depth, where the peak element(s) concentration depth is between 100 and 500 angstroms below the planarized top surface 230. The workpiece 152 may be annealed using methods known to one skilled in the art to reduce damage created by an ion implantation process.

In a preferred embodiment of the invention, a GCIB is used to infuse the element(s), providing a depth between 50 and 200 angstroms for the doped layer 240. In an additional embodiment, the GCIB is used to infuse the element(s) up to a depth of about 300 angstroms.

A material source 245 may comprise a single species such as phosphine (PH$_3$) or it may comprise a plurality of species including phosphine and a second condensable source gas and/or a non-condensable source gas such as helium, neon, and/or hydrogen.

Figure 2C:
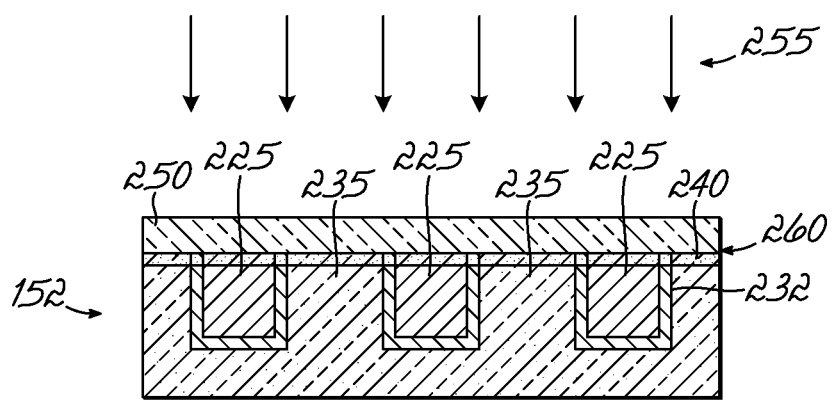
FIG. 2C is an illustration of the workpiece in FIG. 2B after forming a barrier layer over the phosphorous layer.

FIG. 2C is an illustration of the workpiece 152 in FIG. 2B after forming a barrier layer 250 over the doped layer 240. The barrier layer 250 may be formed from a barrier source 255. The barrier layer 250 is deposited as a conformal layer on the doped layer 240 using methods known to persons having ordinary skill in the art, such as chemical vapor deposition (CVD), plasma enhanced chemical vapor deposition (PECVD), high density plasma chemical vapor deposition (HDPCVD), metal organic chemical vapor deposition (MOCVD), atomic layer deposition (ALD), and physical vapor deposition (PVD). The barrier source 255 may comprise dielectric material such as silicon nitride or one or more barrier layer materials such as silicon carbide, nitrogen doped silicon carbide, boron carbon nitride, and boron nitride.

Figure 3:
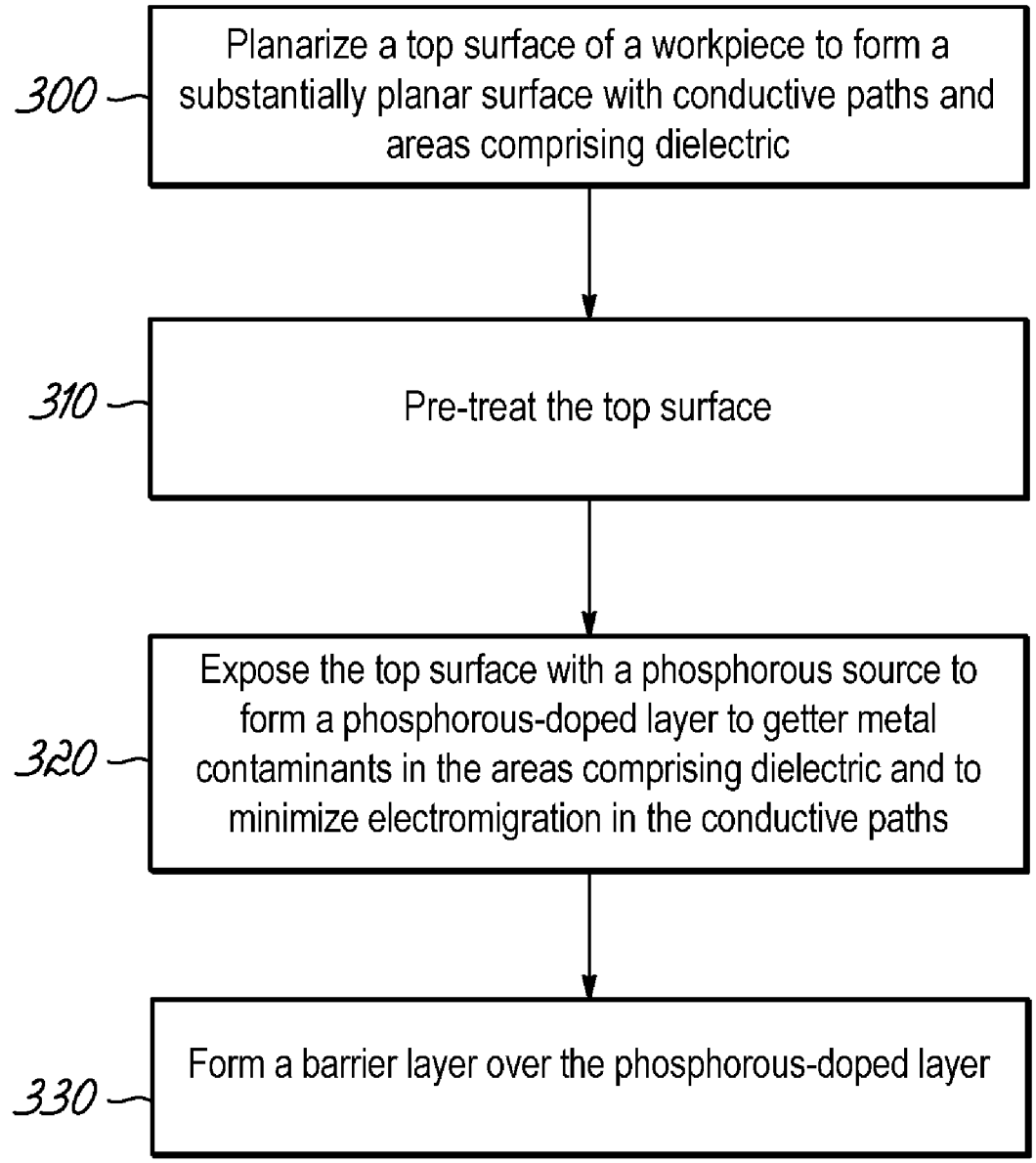
FIG. 3 is a flowchart showing one embodiment of a method of modifying a substantially planar surface of a workpiece with a phosphorous source.

FIG. 3 is a flowchart showing one embodiment of a method of modifying a planarized top surface 230 of a workpiece 152 with a material source 245, such as phosphine. In element 300, a workpiece 152 is planarized to form a substantially planar surface with conductive paths 225 and dielectric regions 235. In element 310, the planarized top surface 230 is pre-treated to reduce or minimize contaminants from the planarized top surface 230. In one example, the pre-treatment may be a wet chemical cleaning process to remove residual particles and material adsorbed on the planarized top surface 230. The wet chemical clean process may use a post-CMP clean chemistry comprising de-ionized water, benzotriazine, and citric acid or a solution particularly designed for post-CMP cleaning such as a ESC-700 series product manufactured by ATMI. In another example, the pre-treatment may be an infusion etching step performed by a GCIB tool to treat or remove a portion of material from the planarized top surface 230. In another example, the pre-treatment may be a sputtering step performed by a PVD tool to treat or remove a portion of material from the planarized top surface 230. While this embodiment includes a pre-treatment, element 310 is optional. In element 320, the planarized top surface 230 is treated with a material source 245 to form a doped layer 240 to getter metal contaminants in the dielectric regions 235 and to minimize electromigration in the conductive paths 225. In element 330, a barrier layer comprising a barrier material such as silicon nitride, silicon carbide, nitrogen doped silicon carbide, boron carbon nitride, and boron nitride is formed over the doped layer.

A plurality of embodiments for methods to improve electrical leakage performance and to minimize electromigration in semiconductor devices has been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or upper layer is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

In the description and claims, the terms "coupled" and "connected," along with their derivatives, are used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of forming a doped layer, the method comprising:
    planarizing a top surface of a workpiece to form a substantially planar surface with a plurality of copper conductive paths and a plurality of dielectric regions;
    infusing a dopant material into and below the planarized top surface of the workpiece using a gas cluster ion beam (GCIB) to form a doped layer from the top surface to a desired depth of about 50-200 angstroms beneath the top surface in the plurality of copper conductive paths and the plurality of dielectric regions, wherein the dopant material comprises one or more dopant elements selected from the group consisting of B, C, Si, Ge, N, P, As, O, S, and Cl, and wherein said doped layer comprises between 0.1 atomic % and 10 atomic % of the dopant material; and
    forming a diffusion barrier layer over the doped layer as a barrier to diffusing copper atoms, wherein the doped layer minimize electromigration of copper in the conductive paths.

2. The method of claim 1, wherein the material source comprises phosphine and a non-condensable source gas selected from the group consisting of helium, neon, and hydrogen.

3. The method of claim 2, further including a second condensable gas source selected from the group consisting of argon, nitrogen, carbon dioxide, and oxygen.

4. The method of claim 1, wherein the GCIB comprises $SiH_4$, $Si_2H_6$, $SiH_2Cl_2$, $SiCl_3H$, methylsilane, dimethylsilane, trimethylsilane, tetramethylsilane, ethylsilane, diethylsilane, triethylsilane, tetraethylsilane, $SiCl_4$, $SiF_4$, $GeH_4$, $Ge_2H_6$, $GeH_2Cl_2$, $GeCl_3H$, methylgermane, dimethylgermane, trimethylgermane, tetramethylgermane, ethylgermane, diethylgermane, triethylgermane, tetraethylgermane, $GeCl_4$, $GeF_4$, $N_2$, $H_2$, $O_2$, NO, $NO_2$, $N_2O$, $NH_3$, $NF_3$, HCl, $SF_6$, CO, $CO_2$, $C_2H_4$, $CH_4$, $C_2H_2$, $C_2H_6$, $C_3H_4C_3H_6$, $C_3H_8$, $C_4H_6$, $C_4H_8$, $C_4H_{10}$, $C_5H_8$, $C_5H_{10}$, $C_6H_6$, $C_6H_{10}$, $C_6H_{12}$, $BF_3$, $B_2H_6$, $AsH_3$, $AsF_5$, $PH_3$, $PF_3$, $PCl_3$, or $PF_5$, or any combination of two or more thereof.

5. The method of claim 1, further including a pre-treatment step prior to infusing the dopant material into the planarized top surface of the workpiece.

6. The method of claim 1, wherein the substantially planar surface is planarized by a chemical mechanical planarization or an electropolishing process.

7. The method of claim 1, wherein the diffusion barrier layer is selected from the group consisting of silicon nitride, silicon carbide, nitrogen doped silicon nitride, boron carbon nitride, and boron nitride.

8. A method of minimizing electromigration in copper conductive paths, the method comprising:
    forming one or more copper conductive paths on a workpiece; and
    infusing a phosphorus dopant into and below the top surface of the workpiece using a gas cluster ion beam to form a phosphorus-doped layer from the top surface to a desired depth of about 50-200 angstroms beneath the top surface in the one or more copper conductive paths wherein the presence of the phosphorus dopant is effective to minimize electromigration in the one or more copper conductive paths, and wherein said phosphorus-doped layer comprises between 0.1 atomic % and 10 atomic % of the phosphorus dopant.

9. The method of claim 8, wherein the gas cluster ion beam comprises $PH_3$, $PF_3$, $PCl_3$, or $PF_5$, or any combination of two or more thereof, and a non-condensable source gas selected from the group consisting of helium, neon, and hydrogen.

10. The method of claim 8, further including pre-treating the top surface of the workpiece prior to infusing the phosphorus dopant.

* * * * *

UNITED STATES PATENT AND TRADEMARK OFFICE
CERTIFICATE OF CORRECTION

PATENT NO. : 8,192,805 B2
APPLICATION NO. : 12/338582
DATED : June 5, 2012
INVENTOR(S) : Noel Russell et al.

Page 1 of 1

It is certified that error appears in the above-identified patent and that said Letters Patent is hereby corrected as shown below:

In the Specifications:

Col. 4, line 10, "over-scan is" should read --over-scan are--.

Col. 4, line 17, "faraday cup" should read --Faraday cup--.

In the Claims:

Col. 7, line 33, Claim 1, "layer minimize" should read --layer minimizes--.

Col. 8, line 7, Claim 4, "$C_3H_4C_3H_6$," should read --$C_3H_4$, $C_3H_6$,--.

Signed and Sealed this
Thirty-first Day of July, 2012

David J. Kappos
*Director of the United States Patent and Trademark Office*